(12) United States Patent
Etherton et al.

(10) Patent No.: US 9,076,656 B2
(45) Date of Patent: Jul. 7, 2015

(54) ELECTROSTATIC DISCHARGE (ESD) CLAMP CIRCUIT WITH HIGH EFFECTIVE HOLDING VOLTAGE

(71) Applicant: Freescale Semiconductor, Inc., Austin, TX (US)

(72) Inventors: Melanie Etherton, Austin, TX (US); Alex P. Gerdemann, Austin, TX (US); James W. Miller, Austin, TX (US); Mohamed S. Moosa, Round Rock, TX (US); Robert S. Ruth, Austin, TX (US); Michael A. Stockinger, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 99 days.

(21) Appl. No.: 13/875,618

(22) Filed: May 2, 2013

(65) Prior Publication Data

US 2014/0327079 A1   Nov. 6, 2014

(51) Int. Cl.
*H01L 27/02* (2006.01)
(52) U.S. Cl.
CPC ........ *H01L 27/0292* (2013.01); *H01L 27/0285* (2013.01)
(58) Field of Classification Search
CPC .................. H01L 27/0292; H01L 27/0285
See application file for complete search history.

(56) References Cited

U.S. PATENT DOCUMENTS

| 6,724,603 | B2 | 4/2004 | Miller et al. |
| 6,850,397 | B2 | 2/2005 | Russ et al. |
| 6,970,336 | B2 * | 11/2005 | Stockinger et al. ............. 361/56 |
| 7,446,990 | B2 | 11/2008 | Miller et al. |
| 7,589,945 | B2 | 9/2009 | Miller et al. |
| 7,593,202 | B2 | 9/2009 | Khazhinsky et al. |
| 2007/0127173 | A1 | 6/2007 | Chang |

OTHER PUBLICATIONS

Mergens et al., "Speed Optimized Diode-Triggered SCR (DTSCR) for RF ESD Protection of Ultra-Sensitive IC Nodes in Advanced Technologies", IEEE Transactions on Device and Materials Reliability, vol. 5, No. 3, Sep. 2005, pp. 532-542.

* cited by examiner

*Primary Examiner* — Long Pham
(74) *Attorney, Agent, or Firm* — Luiz von Paumgartten; Fogarty, L.L.C.

(57) ABSTRACT

Boosted Electrostatic Discharge (ESD) clamp circuit with high effective holding voltage. In some embodiments, an integrated circuit may include a trigger circuit operably coupled to a first voltage bus and to a reference bus; a diode including an anode terminal operably coupled to a second voltage bus, the second voltage bus distinct from the first voltage bus; a transistor including a gate operably coupled to an output terminal of the trigger circuit, a drain operably coupled to a cathode terminal of the diode, and a source operably coupled to the reference bus; and an input/output (I/O) cell operably coupled to the first voltage bus, the second voltage bus, and the reference bus.

18 Claims, 8 Drawing Sheets

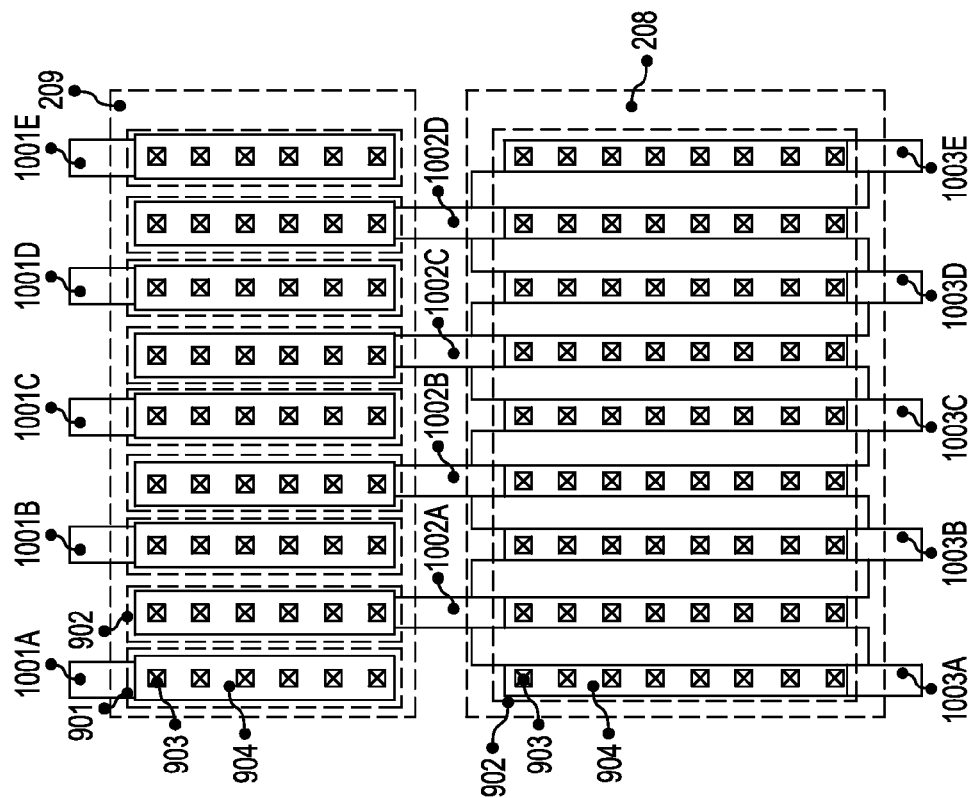
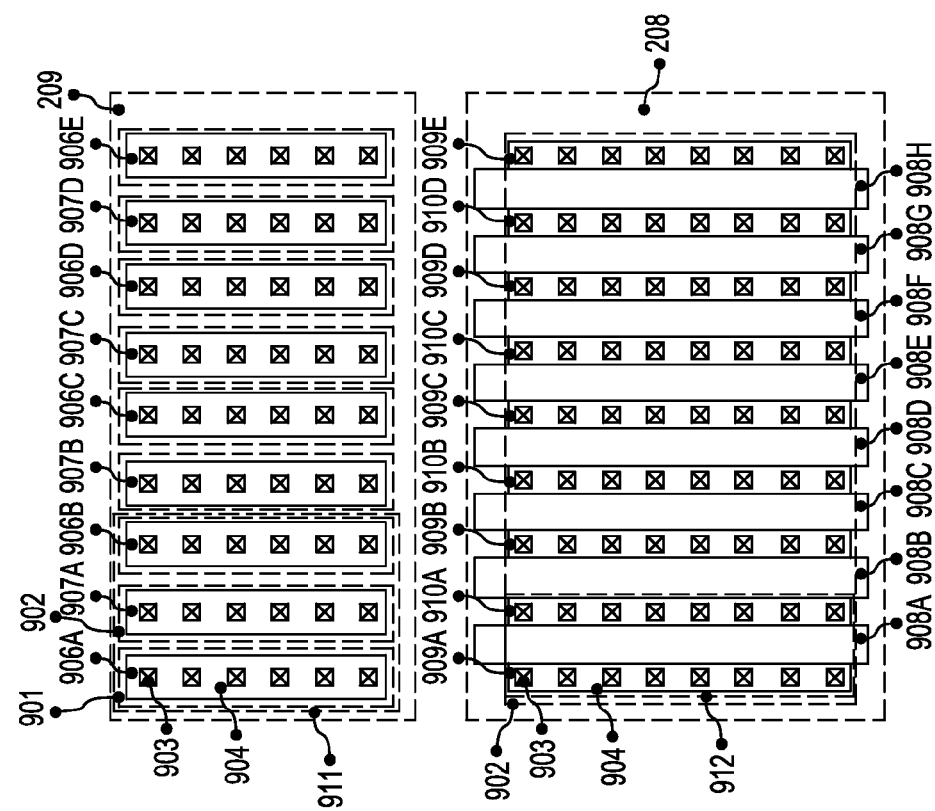
FIG. 10
FIG. 9

US 9,076,656 B2

ELECTROSTATIC DISCHARGE (ESD) CLAMP CIRCUIT WITH HIGH EFFECTIVE HOLDING VOLTAGE

FIELD

This disclosure relates generally to electronic devices, and more specifically, to Electrostatic Discharge (ESD) clamp circuits.

BACKGROUND

Integrated circuits (ICs) and other semiconductor devices are sensitive to Electrostatic Discharge (ESD) events. Generally speaking, an ESD event results from the quick discharge of a previously charged object or person, which yields a high current pulse of short duration. For example, a person carrying even a relatively small electric charge, upon inadvertently touching the electrical terminals of an IC, may cause the outright failure of the IC's internal components. Also, in some cases, the degradation caused by ESD may affect the long-term reliability of ICs.

To protect against ESD events, an IC may be provided with circuitry that promotes the safe dissipation of electrostatic discharges. An example of an ESD protection circuit is the N-type Metal-Oxide-Semiconductor (NMOS) or P-type MOS (PMOS) clamp. In the presence of an ESD event, the clamp is configured to become conductive and to cause the excess current to flow to the ground.

The inventors hereof have noted, however, that traditional ESD protection circuitry tends to fail under certain circumstances. For instance, Burn-In (BI) processes that are now commonly used during semiconductor manufacturing can cause Electrical Overstress (EOS) damage in ESD clamps. Other EOS conditions (e.g., noisy power environments, etc.) may also negatively affect the performance of ESD protection circuits.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

FIGS. 9 and 10 are diagrams of an ESD clamp according to some embodiments.

DETAILED DESCRIPTION

Figure 1:
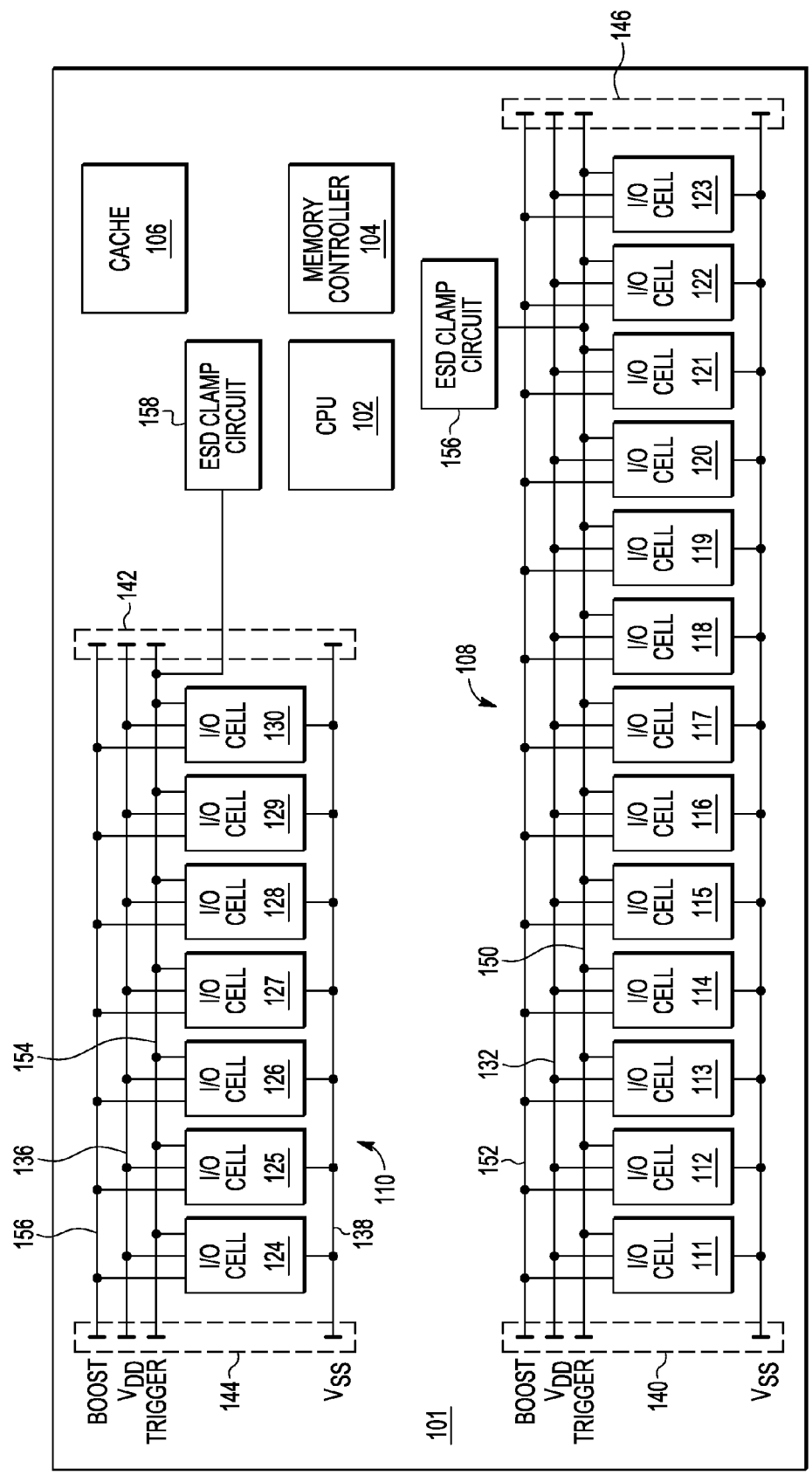
FIG. 1 is a diagram illustrating an example of an Integrated Circuit (IC) with Electrostatic Discharge (ESD) protection for input/output (I/O) cells according to some embodiments.

Disclosed are boosted Electrostatic Discharge (ESD) clamp circuits with high effective holding voltage. As used here, the term "holding voltage" or "$V_{hold}$" refers to the lowest drain-to-source ($V_{ds}$) voltage at which a Metal-Oxide-Semiconductor (MOS) transistor will sustain bipolar conduction once it is turned on. Because the term $V_{hold}$ is typically applied to an ESD clamp formed from a single device, the term "effective $V_{hold}$" is used here to describe the $V_{hold}$ of an ESD clamp formed by two or more components coupled to each other in series.

In some embodiments, an n-channel MOS (NMOS) or p-channel MOS (PMOS) transistor may be used to protect an Integrated Circuit (IC) from ESD events. In the presence of such ESD events, and when the IC is not powered, a MOS transistor can operate in bipolar breakdown as a parasitic bipolar junction transistor (BJT), whereby the surface conduction of the transistor switches to bipolar conduction through the bulk. Under these conditions, the drain of the transistor acts as a collector, the substrate acts as a base, and the source acts an emitter, for example, to form an NPN transistor capable of dissipating large ESD currents to ground.

During the IC's powered operation, it is also possible for the ESD clamp transistor to enter bipolar breakdown. In this mode, however, the breakdown can lead to a sustained bipolar conduction condition, thus causing heating which ultimately leads to damage in the ESD clamp circuit. Such damage may occur, for instance, during a Burn-In (BI) process of semiconductor production, during operation of the semiconductor device in an environment with noisy power supplies, or, more generally, in a wide range of Electrical Overstress (EOS) situations.

As used herein, the term "Burn-In" refers to a process by which components of an IC, chip, board, or device are exercised by applying various electrical signals to it, during or immediately after manufacturing, and prior to the IC, chip, board, or device being placed into the field. The term "Electrical Overstress" refers more generally to conditions where damage to an IC, electronic chip, board, or device may occur because the IC, electronic chip, board, or device is subjected to a current or voltage that is greater than provided in its specifications or design.

For example, during a BI process, 6 V may be applied to a nominally 5 V supply bus for an extended period of time. If a MOS transistor within an ESD clamp has a holding voltage ($V_{hold}$) is at or below 6 V, any noise spike large enough to turn on the transistor in bipolar conduction can lead to a sustained operation in bipolar mode, even when the supply voltage returns to the normal BI voltage of 6 V. More generally, the foregoing may occur in any situation where $V_{hold}$ is less than or equal to the BI voltage. The resulting continuous high current through the ESD clamp may damage the clamp itself. In some cases, when the $V_{hold}$ of a MOS transistor used as an ESD clamp is below the normal supply voltage, these events with resulting catastrophic failures can also occur during normal powered operation of the IC.

Accordingly, in some embodiments, the effective $V_{hold}$ of the ESD clamp may be increased by adding a diode in series with the MOS transistor. In some implementations, the added diode may provide an increase in effective $V_{hold}$ that protects the MOS transistor from remaining in bipolar breakdown for extended periods of time.

Moreover, in order to compensate for the reduced conductance of the ESD clamp (caused by adding the diode in series with the MOS transistor) during an ESD event, a boost circuit may be provided to overdrive a gate of the MOS transistor such that the gate-to-source voltage ($V_{gs}$) of the MOS transistor is greater than its drain-to-source voltage ($V_{ds}$). In some embodiments, the boost circuit may increase the conductance of the MOS transistor, thus making it possible to achieve both target ESD performance and a higher ESD clamp effective $V_{hold}$ using a reasonable layout area.

Referring to FIG. 1, an example of an IC with ESD protection for I/O cells is shown according to some embodiments. As illustrated, IC 100 includes substrate 101, central processing unit (CPU) 102 and a plurality of peripheral components, such as memory controller 104 and cache 106. IC 100 further includes a plurality of I/O cells to receive signals from, and provide signals to, components external to the IC 100. In this case, the plurality of I/O cells is implemented in first I/O cell bank 108 and in second I/O cell bank 110. First I/O cell bank 108 includes I/O cells 111-123 disposed at substrate 101 and second I/O cell bank 110 includes I/O cells 124-130 disposed at substrate 101.

The term "I/O," as used herein, refers to input, output, or a combination thereof. Accordingly, the term "I/O cell," as used herein, refers to any of an input-only cell, an output-only cell, or a cell configurable as both an input cell and an output cell. The term "transistor," as used herein, refers to a single transistor or an array of transistors, when the single transistor or some or all of the transistors of an array of transistors may be implemented as a single-segment transistor or as a transistor comprising a plurality of segments (or "fingers").

I/O cells 111-123 of first I/O cell bank 108 are connected to a first power domain represented by $V_{DD}$ bus 132 and $V_{SS}$ bus 134. Meanwhile, I/O cells 124-130 of second I/O cell bank 110 are connected to a separate second power domain represented by a $V_{DD}$ bus 136 and $V_{SS}$ bus 138. Here, for sake of illustration, $V_{DD}$ bus 132 is terminated at terminating ends 140 and 142, while $V_{DD}$ bus 136 is terminated at terminating ends 144 and 146, such that $V_{DD}$ bus 132 and $V_{DD}$ bus 136 are not continuous buses in IC 100 and constitute two separate power domains.

In this example, I/O cells 111-123 are connected to trigger bus 150 and "BOOST" bus 152, while I/O cells 124-130 are connected to a separate trigger bus 154 and "BOOST" bus 156. In an embodiment, I/O cells 111-123 of I/O cell bank 108 may be distributed (evenly or unevenly) along the length of $V_{DD}$ bus 132 between terminating end 140 and terminating end 142 of the $V_{DD}$ bus 132, and I/O cells 124-130 of I/O cell bank 110 may be distributed (evenly or unevenly) along the length of $V_{DD}$ bus 136 between terminating end 144 and terminating end 146 of $V_{DD}$ bus 136. In the illustrated embodiment, $V_{SS}$ bus 134, BOOST bus 152, and trigger bus 150 are terminated at terminating ends 140 and 142 to match $V_{DD}$ bus 132. Similarly, $V_{SS}$ bus 138, BOOST bus 156, and trigger bus 154 are terminated at terminating ends 144 and 146 to match $V_{DD}$ bus 136. Alternatively, $V_{SS}$ bus 134 and $V_{SS}$ bus 138 may be shorted together, thereby forming a continuous single $V_{SS}$ bus.

IC 100 further includes ESD clamp circuit 156 associated with I/O bank 108 and ESD clamp circuit 158 associated with I/O bank 110. ESD clamp circuit 156 has an output connected to trigger bus 150, and inputs (not shown) connected to BOOST bus 152 and $V_{SS}$ bus 134. ESD clamp circuit 158 has a trigger output connected to trigger bus 154, and inputs (not shown) connected to BOOST bus 156 and $V_{SS}$ bus 138. As illustrated, ESD clamp circuits 156 and 158 may be remote, or separate, from the I/O cells which form I/O cell banks 108 and 110, respectively. Alternatively, ESD clamp circuit 156 may be implemented at one or more of the I/O cells 111-123, and ESD clamp circuit 158 may be implemented at one or more of the I/O cells 124-130. In another, alternative embodiment, some or all of the I/O cells may include a separate ESD clamp circuit.

For purposes of discussion, components shown in FIG. 1 are illustrated in the context of a microprocessor. As further noted below, however, these ESD protection techniques may be similarly employed in other types of electronic devices, such as Application Specific ICs (ASICs), microcontrollers, Systems-on-a-Chip (SOCs), and the like. Further, although the circuit implementations disclosed herein are illustrated using MOS transistors, such as silicon substrate and silicon on insulator MOS field effect transistors (MOSFETs), other transistor types, such as bipolar junction transistors, Multiple Independent Gate FETs (MIGFETs) and other materials, such as silicon germanium, may be implemented as appropriate without departing from the scope of the present disclosure. In addition, though transistor devices are illustrated herein as n-channel MOSFETs, other clamp devices, including p-channel MOSFETs, two or more series n-channel or p-channel MOSFETs, a bipolar junction transistor, or semiconductor controlled rectifiers (SCR) may be used without departing from the scope of the present disclosure.

Figure 2:
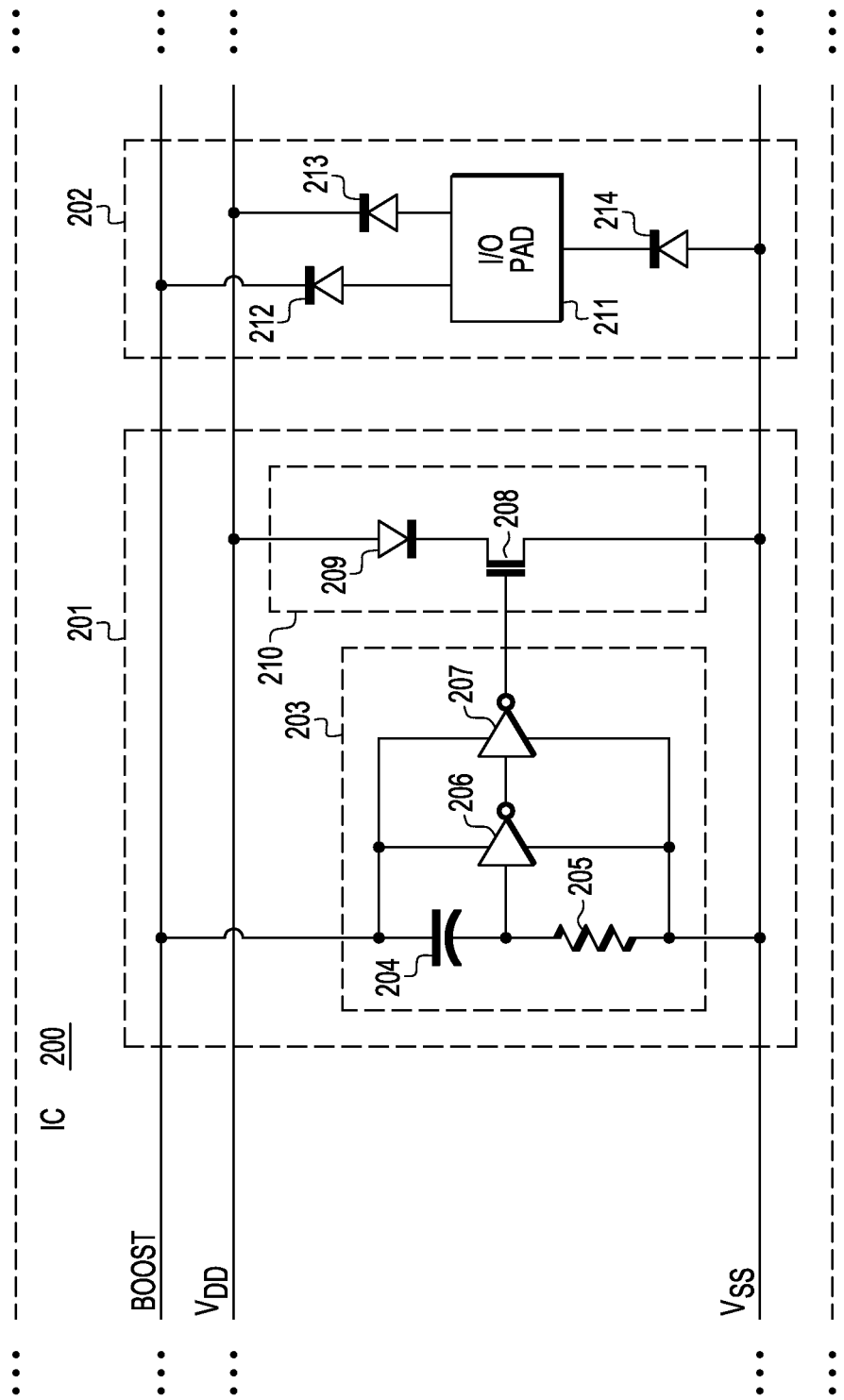
FIG. 2 is a circuit diagram of an ESD clamp circuit according to some embodiments.

FIG. 2 is a circuit diagram of ESD clamp circuit 201 according to some embodiments. In this example, IC 200 is protected by ESD clamp circuit 201 in the presence of ESD events affecting I/O cell 202. Referring back to FIG. 1, here IC 200 represents IC 100, ESD clamp circuit 201 represents one of ESD clamp circuits 156 or 158, and I/O cell 202 represents one of I/O cells 111-130. As such, in certain implementations, ESD clamp circuit 201 may be remote, or separate, from the I/O cell 202. Moreover, a number of I/O cells may be coupled to I/O cell 202 (e.g., via a $V_{DD}$ and/or $V_{SS}$ bus) to form an I/O cell bank.

For ease of explanation, trigger bus 150/154 shown in FIG. 1 is omitted from FIG. 2. It should be understood, however, that in some cases the output of trigger circuit 203—e.g., the output of inverter 107—and/or the gate of NMOS transistor 208 may be coupled to a trigger bus as shown in FIG. 1, so that a same trigger circuit 203 may serve two or more ESD clamps similar to ESD clamp 201.

As illustrated, ESD clamp circuit 201 includes trigger circuit 203 coupled to ESD clamp 210. ESD clamp circuit 201 includes ESD clamp 210 having diode 209 in series with NMOS transistor 208, the combination of which is configured to couple high ESD currents between voltage bus $V_{DD}$ and reference bus $V_{SS}$ (e.g., ground). Particularly, the anode terminal of diode 209 is coupled to $V_{DD}$, the cathode terminal of diode 209 is coupled to the drain of NMOS transistor 208, and the source of NMOS transistor 208 is coupled to $V_{SS}$. Meanwhile, trigger circuit 203 includes capacitor 204, resistor 205, first inverter 206, and second inverter 207 operably coupled to the gate of NMOS transistor 208. It should be noted, however, that in other implementations other trigger circuits may be used.

In some cases, diode 209 may provide a 1.0 to 1.5 V increase in effective $V_{hold}$ of ESD clamp 210 to reduce failure due to EOS conditions or events (e.g., BI, etc.). Also, in some embodiments, the effective $V_{hold}$ may be set sufficiently small to allow desired bipolar conduction during ESD events, but yet higher than $V_{DD}$ to enable robust BI and noise immunity.

During ESD events, ESD clamp 210 is actively triggered and operates in both MOS and bipolar modes. In operation, trigger circuit 203 acts a slew rate sensor or detector configured to respond to slew rates that are typical of ESD (fast), but not to normal voltage power-up events (slow). When trigger circuit 203 fires and its output is at a logic HIGH, the $V_{gs}$ of NMOS transistor 208 is elevated, hence allowing ESD clamp 210 to dissipate ESD currents introduced, for example, at I/O node, terminal, pin, or pad 211. To compensate for the reduced conductance caused by the addition of diode 209, trigger circuit 203 is powered by a BOOST bus distinct from $V_{DD}$.

As shown in FIG. 2, the BOOST bus is coupled to I/O pad 211 via diode 212, and the $V_{DD}$ bus is coupled to I/O pad 211 via diode 213. The I/O pad 211 is coupled to $V_{SS}$ via diode 214, which is configured to dissipate currents associated with a negative ESD event on I/O pad 211 itself (as opposed to reference bus $V_{SS}$). In some implementations, diode 212 may be selected to be much smaller than diodes 213 and/or 214.

In some cases, the main ESD discharge path is through diode 213, voltage bus $V_{DD}$, and ESD clamp 210. As a result, the majority of the ESD current flows through diode 213, voltage bus VDD, diode 209, and MOS transistor 208. A smaller fraction of the ESD current flows through diode 212 and the BOOST bus. As a result, the voltage drop across diode 213 and voltage bus $V_{DD}$ is larger than the voltage drop across diode 212 and the BOOST bus. Therefore, during an ESD event, the potential supplying trigger circuit 203 is higher compared to the potential on voltage bus $V_{DD}$ in the same location. As a consequence, trigger circuit 203's output is higher than the anode terminal of diode 209, which effectively results in overdriving NMOS transistor 208 ($V_{gs} \gg V_{ds}$). This increases the conductance of ESD clamp 210 compared to a situation where the gate terminal of NMOS transistor 208 is not overdriven by a BOOST bus ($V_{gs} \leq V_{ds}$).

Figure 3:
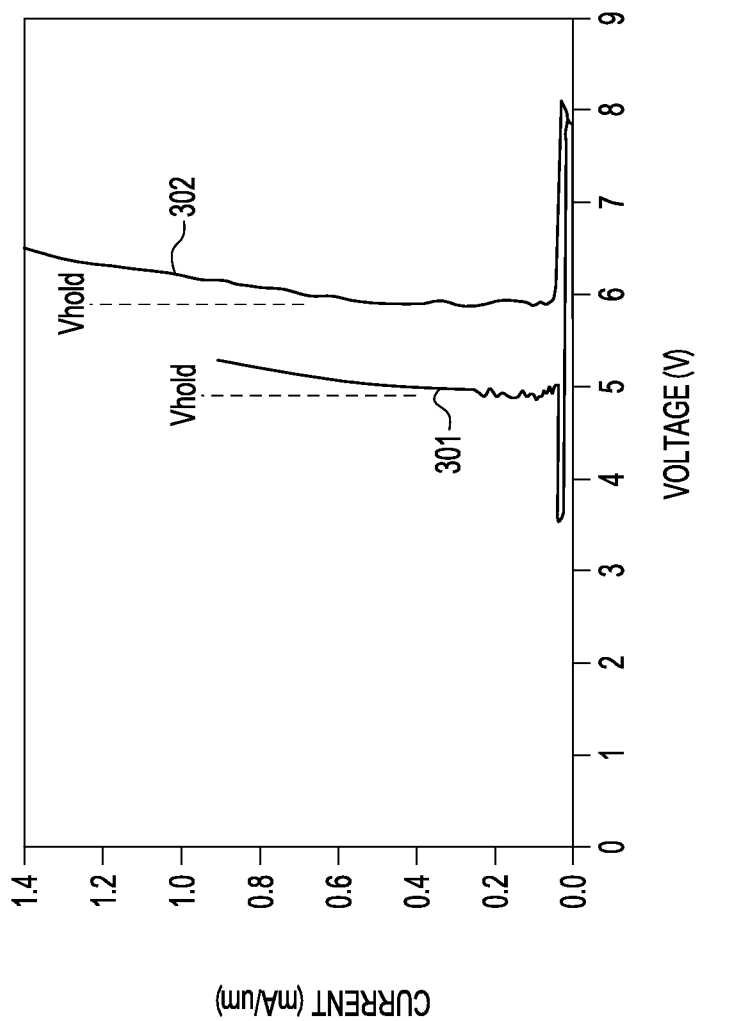
FIG. 3 shows a graph illustrating an increased effective holding voltage of the ESD clamp circuit according to some embodiments.

FIG. 3 shows a current-against-voltage (IV) graph 300 illustrating an increased effective $V_{hold}$ of ESD clamp 210 according to some embodiments. Curve 301 shows the parasitic bipolar junction transistor behavior of NMOS transistor 208 in the absence of diode 209. It can be seen that high current bipolar conduction is possible at voltages above about 6 V. Curve 302 shows that the addition of diode 209 in series with NMOS transistor 208 increases the effective $V_{hold}$ of ESD clamp 210 by about 1.5 V.

Figure 5:
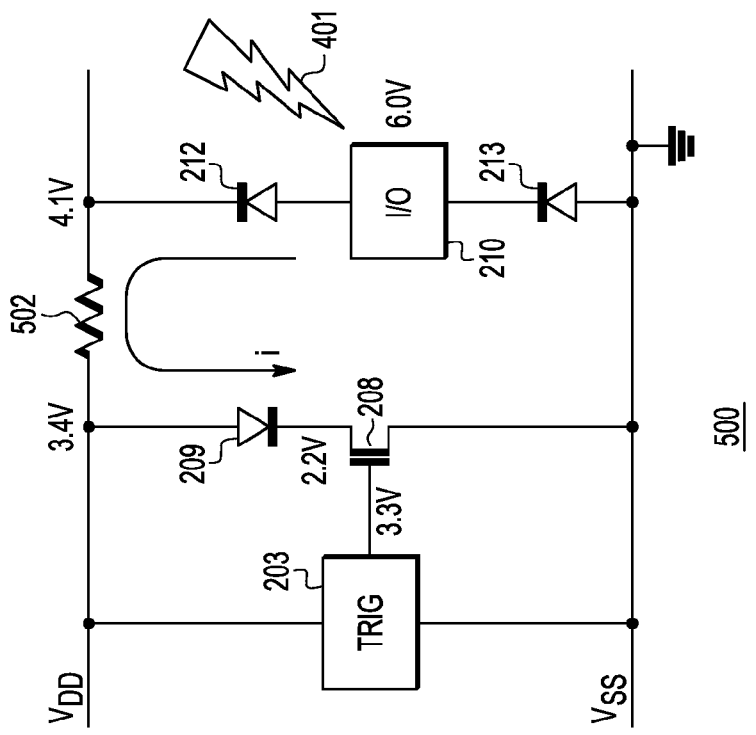
FIGS. 4 and 5 are circuit diagrams illustrating operations of "prior art" ESD clamp circuits.
Figure 4:
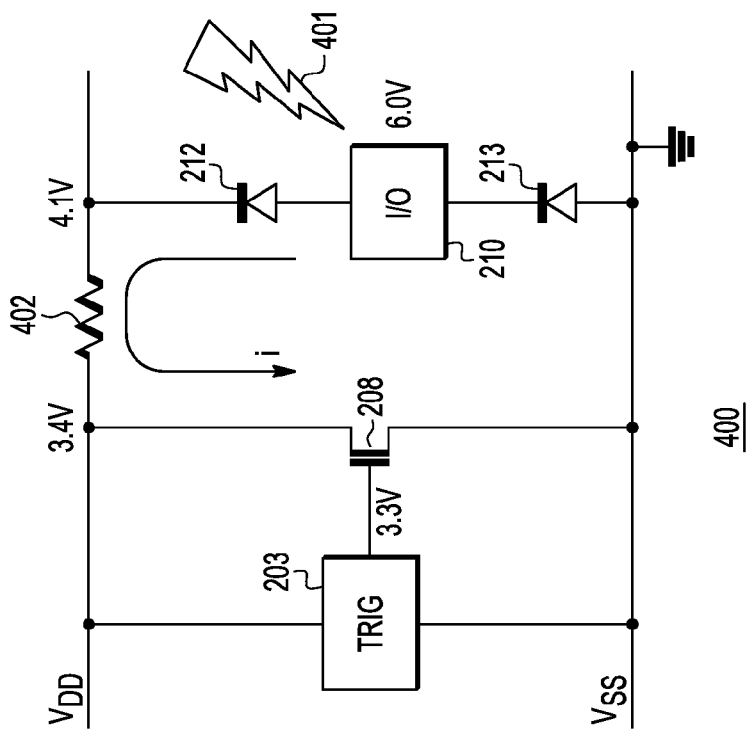
Figure 6:
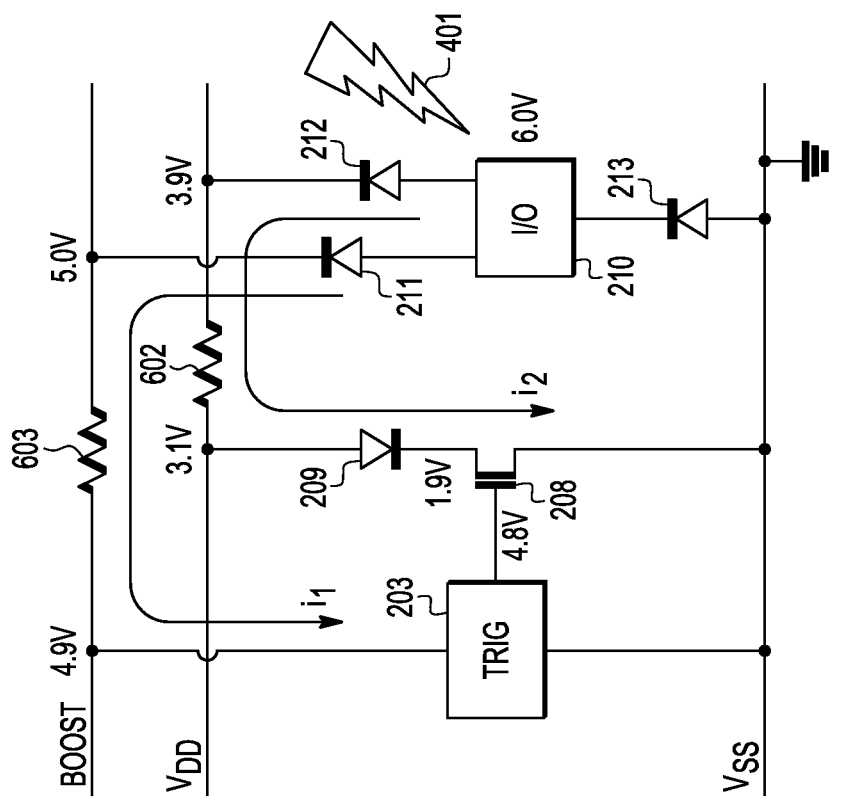
FIG. 6 is a circuit diagram illustrating operations of an ESD clamp circuit according to some embodiments.

To facilitate the understanding of how a boosted ESD clamp with high effective $V_{hold}$ operates, FIGS. 4 and 5 are circuit diagrams illustrating prior art ESD protection circuits, and FIG. 6 is a circuit diagram of an ESD protection circuit according to some embodiments disclosed herein. All three cases were specifically designed to limit the voltage difference between I/O pad 211 and the reference bus $V_{SS}$ to 6 V during an ESD event 401 on I/O pad 211 with respect to $V_{SS}$. In each case, the ESD protection circuitry is subject to ESD event 401, which results in a 3.8 A current spike. Diode 213 has a fixed width of 158 μm, and transistor 208 is sized to meet a 6.0 V target at I/O pad 211. Also, since any supply bus will have some resistance, it is assumed that a 0.2Ω parasitic resistance exists in the $V_{DD}$ bus between I/O pad 211 and the ESD protection circuitry.

In the first prior art case shown in FIG. 4, the BOOST bus as well as diodes 209 and 212 originally shown in FIG. 2 are absent. ESD event 401 causes the node between diode 213 and the $V_{DD}$ bus to reach 4.1 V. The voltage at the node between the $V_{DD}$ bus and NMOS transistor 208 reaches 3.4 V due to the resistive effects of the $V_{DD}$ bus, represented as resistor 402. Thus, the voltage applied at the gate of NMOS transistor 208 by trigger circuit 203 is 3.3 V, and NMOS transistor 208 dissipates ESD current i. To achieve these results, the surface area occupied by NMOS transistor 208 in this particular example is 6037 μm². As previously noted, however, the $V_{hold}$ of NMOS transistor 208 in such a design may not be sufficiently high to prevent damage from BI or EOS conditions.

Second prior art circuit 500 of FIG. 5 is similar to that of FIG. 4, but diode 209 is added in series with NMOS transistor 208, at least in part, to address the aforementioned BI and/or EOS concerns. Again, the voltage at I/O pad reaches 6 V during an ESD event 401 on the I/O pad, for example, with respect to $V_{SS}$, which causes the node between diode 213 and the $V_{DD}$ bus to reach 4.1 V. However, although the voltage at the node between the $V_{DD}$ bus and diode 209 is 3.4 V—due to resistive effects represented by resistor 502—a 1.2 V drop across diode 209 causes the drain-to-source ($V_{ds}$) voltage across NMOS transistor 208 to be 2.2 V. The voltage applied at the gate of NMOS transistor 208 by trigger circuit 203 is still 3.3 V, and NMOS transistor 208 dissipates ESD current i. In this case, in order to be capable of clamping the same ESD current i to ground with the same voltage drop across I/O pad 211, the surface area occupied by diode 209 in combination with NMOS transistor 208 is 16,660 μm²—i.e., ~2.8 times higher than the area occupied by NMOS transistor 208 alone in circuit 400.

In other words, although second prior art circuit 500 of FIG. 5 may address BI and/or EOS concerns associated with first prior art circuit 400 of FIG. 4, the resulting ESD protection devices have to be much larger in order to also meet the same ESD target protection level.

To address these, and other problems, circuit 600 of FIG. 6 shows an embodiment where diode 209 is in series with NMOS transistor 208, and BOOST bus is coupled to I/O pad 211 via diode 212. The total size of diodes 212 and 213 in FIG. 5 combined are the same size as diode 213 in FIG. 4 and FIG. 5. In this example, during ESD event 401, a first, smaller portion of the ESD current ($i_1$) flows through the BOOST bus, and a second, larger portion of the ESD current ($i_2$) flows through the $V_{DD}$ bus. Due to the relatively small current $i_1$ compared to $i_2$, the voltage drop across diode 212 is much lower than the voltage drop across diode 213. In addition, the voltage drop due to the resistive effects of the busses is much lower on bus BOOST compared to bus $V_{DD}$. As a consequence, in this example, trigger circuit 203 is biased at a high voltage of 4.9 V by the BOOST bus (due to resistive effects represented by resistor 603).

Moreover, the node between diode 213 and the $V_{DD}$ bus is at 3.9 V, and the node between the $V_{DD}$ bus and diode 209 is at 3.1 V (due to resistive effects represented by resistor 602). In response to a higher input voltage (e.g., compared to 3.4 V in the example of FIG. 4), trigger circuit 203 overdrives the gate of NMOS transistor 208 with a gate-to-source voltage ($V_{gs}$) of 4.8 V. Consequently, the conductance of NMOS transistor 208 per width is much higher than in the example of FIG. 5, causing the drain-to-source ($V_{ds}$) voltage across NMOS transistor 208 in FIG. 6 to be 1.9 V. Moreover, in this case, the physical area occupied by diode 209 in combination with NMOS transistor 208 is 7,878 μm²—i.e., only approximately 1.3 times greater than first prior art circuit 400 of FIG. 4 and less than half of the more BI and EOS tolerant circuit 500 of FIG. 5.

In sum, still referring to FIG. 6, diode 209 increases the effective $V_{hold}$ of ESD clamp 210 having diode 209 in series with transistor 208 to protect circuit 600 from BI and/or EOS conditions. Also, the use of the BOOST bus enables circuit 600 to maintain a target level of ESD protection with small footprint.

In certain implementations, the current-carrying requirements of diode 209 in series with NMOS transistor 208 are such that they may be configured as multiple components in parallel. In that regard, FIGS. 7 and 8 are circuit diagrams illustrating parallel ESD clamp circuit components.

Figure 7:
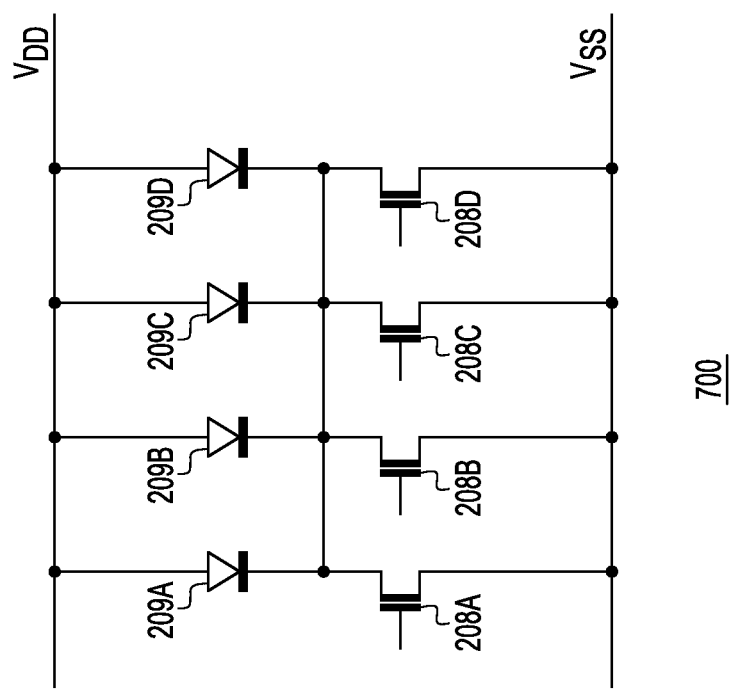

Particularly, the implementation of FIG. 7 shows a number of diodes 209A-D operably coupled to a respective one of NMOS transistors 208A-D. In this example, the gates of each of NMOS transistors 208A-D are coupled to the trigger circuit and/or trigger bus. Although four pairs of diode/transistors are shown, any number and combination of diodes and transistors can be used in other implementations. Also, the number of diode fingers does not have to match the number of NMOS fingers, and may be implemented independently. In this example, the nodes between diodes 209A-D and NMOS transistors 208A-D (referred to as "mid-nodes") are coupled to each other.

During certain EOS events—e.g., Charged Device Model (CDM) ESD events—it may be desirable to operate NMOS transistor 208 in series with diode 209 in bipolar mode to dissipate more current within a smaller layout area to achieve a desired ESD robustness. For short periods of time, such as a CDM ESD event, many MOS transistors can withstand operation in bipolar mode without damage for a certain current level. During an ESD event, any given transistor 208A-D may enter parasitic bipolar conduction. With parallel devices as shown, this phenomenon does not happen simultaneously for all components. Typically, a single one of transistors 208A-D enters bipolar conduction and rapidly decreases the voltage at the mid-node, which prevents other parallel components from entering bipolar conduction, thus resulting in early failure.

Figure 8:
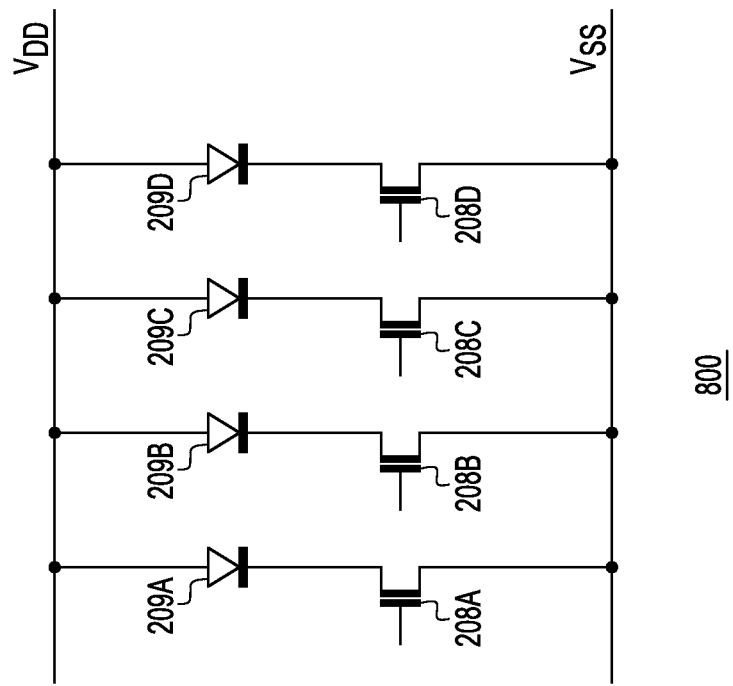
FIGS. 7 and 8 are circuit diagrams illustrating parallel ESD clamp circuit components according to some embodiments.

In some embodiments, to avoid the risk of early failures during CDM ESD events, the nodes between diodes 209A-D and NMOS transistors 208A-D may be isolated from each other, as shown in FIG. 8. Again, the gates of each of NMOS transistors 208A-D are coupled to the trigger circuit and/or trigger bus. In this embodiment, however, each diode finger serves a dual purpose. It increases the effective holding voltage ESD clamp 210 having diode 209 in series with MOS transistor 208, and at the same time serves to provide beneficial current limiting ballasting of the matched MOS transistor finger when it enters bipolar conduction. Here, if a single one of transistors 208A-D enters parasitic bipolar conduction first, the current through its corresponding diode 209A-D creates a voltage drop across the diode. Because there is no current flowing through the other diodes for fingers that have not entered bipolar conduction, the voltage drop across these MOS transistors is effectively higher and increases as more current flows through the already conducting finger. When the voltage becomes high enough, the other transistor fingers of transistors 208A-D are also forced into bipolar conduction. Accordingly, the array diodes 209A-D and NMOS transistors 208A-D conducts uniformly, progressively utilizing the entire device width.

FIG. 9 illustrates an ESD clamp as shown in FIG. 8. Specifically, each finger of diode 209 is formed by N+ doping region 902 in combination with active region 904 and contacts or vias 903. The N+ active diode finger is surrounded by diode well ties formed by P+ doping 901 in combination with active 904 and contacts or vias 903. In this implementation, each diode 209 is formed inside an isolated p-type well that allows to couple the diode anode to a power supply. Diode 209 is formed by multiple N+ active diode fingers 907A-D, which are created by repeating single diode structure 911, and which also results in multiple P+ well ties 906A-E.

The source and drain regions of NMOS transistor 208, here shown as element 912, are formed by N+ doping 902 in combination with active 804 and contacts or vias 903. A source and drain region in combination with one polysilicon region (e.g., 908A), forms one NMOS transistor finger 912. Multiple transistor polysilicion gate regions 908A-H form multiple N+ active source regions 909A-E of transistor 208 and drain regions 910A-D. The diode and NMOS transistor shown in FIG. 9 are implemented in a multi-finger configuration. In other implementations, however, each diode 209 and transistor 208 may include any number of diode and transistor fingers.

FIG. 10 shows the same diagram as in FIG. 9, but with a layer of metal or other interconnect material 1001 coupling each N+ active diode finger 907A-D (forming two diodes with the adjacent P+ well ties) to one of the drain regions 910A-D (which are shared between two transistor fingers). It should be noted that, as in FIG. 9, here mid-nodes 1002A-D between diode 209 and NMOS transistor 208 are not coupled to each other, while the anode fingers of the diode 208 are coupled to one shared node and the source fingers of transistor 209 are coupled to a second shared node.

In many implementations, the systems and methods disclosed herein may be incorporated into a wide range of electronic devices including, for example, computer systems or Information Technology (IT) products such as servers, desktops, laptops, switches, routers, etc.; telecommunications hardware; consumer devices or appliances such as mobile phones, tablets, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Figure 11:
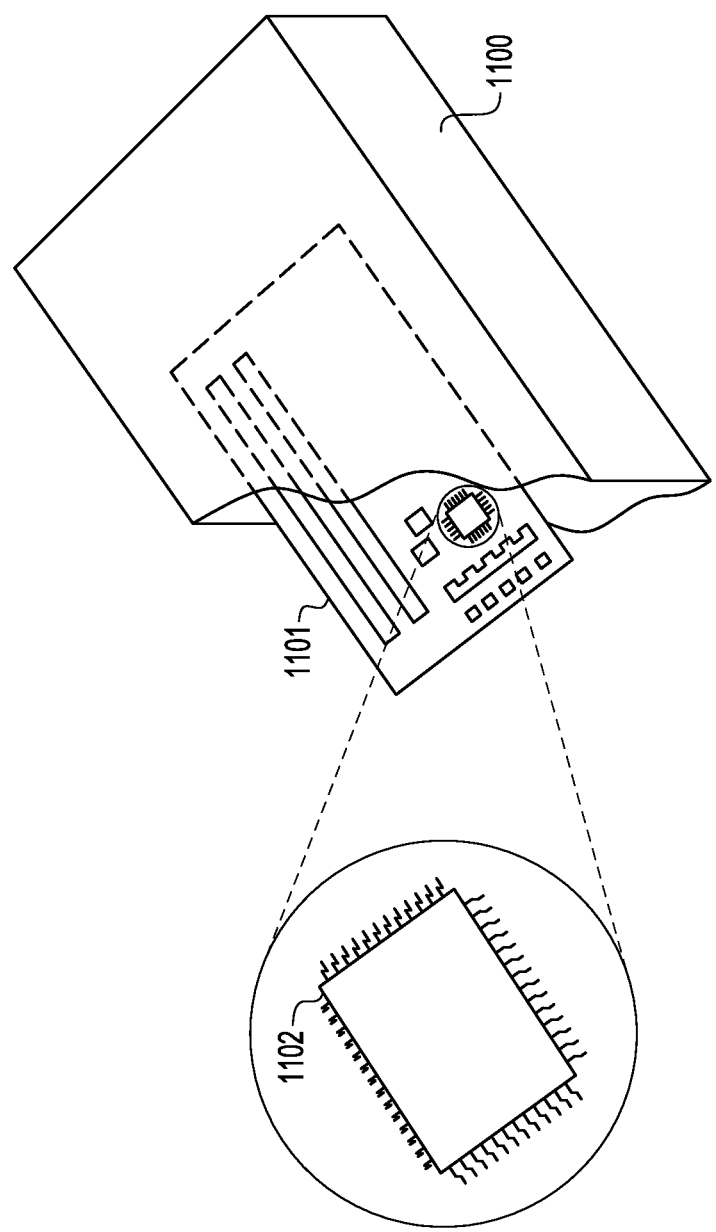
FIG. 11 is a diagram of an example of a Printed Circuit Board (PCB) of a device having one or more electronic chips, according to some embodiments.

Turning to FIG. 11, a block diagram of electronic device 1100 is depicted. In some embodiments, electronic device 1100 may be any of the aforementioned electronic devices, or any other electronic device. As illustrated, electronic device 1100 includes one or more Printed Circuit Boards (PCBs) 1101, and at least one of PCBs 1101 includes one or more chips 1102. In some implementations, one or more ICs (e.g., IC 200 in FIG. 2) within chip 1102 may be protected by one or more ESD protection circuits such as those discussed above.

Examples of IC(s) that may be present within chip 1102 may include, for instance, an SoC, an ASIC, a Digital Signal Processor (DSP), a Field-Programmable Gate Array (FPGA), a processor, a microprocessor, a controller, a microcontroller, a Graphics Processing Unit (GPU), or the like. Additionally or alternatively, IC(s) may include a memory circuit or device such as, for example, a Random Access Memory (RAM), a Static RAM (SRAM), a Magnetoresistive RAM (MRAM), a Nonvolatile RAM (NVRAM, such as "FLASH" memory, etc.), and/or a Dynamic RAM (DRAM) such as Synchronous DRAM (SDRAM), a Double Data Rate RAM, an Erasable Programmable ROM (EPROM), an Electrically Erasable Programmable ROM (EEPROM), etc. Additionally or alternatively, IC(s) may include one or more mixed-signal or analog circuits, such as, for example, Analog-to-Digital Converter (ADCs), Digital-to-Analog Converter (DACs), Phased Locked Loop (PLLs), oscillators, filters, amplifiers, etc. Additionally or alternatively, IC(s) may include one or more Micro-ElectroMechanical Systems (MEMS), Nano-Electro-Mechanical Systems (NEMS), or the like.

Accordingly, an IC within chip 1102 may include a number of different portions, areas, or regions. These various portions may include one or more processing cores, cache memories, internal bus(es), timing units, controllers, analog sections, mechanical elements, etc. In various embodiments, these different portions, areas, or regions may each have a different terminal(s), and therefore may each include or otherwise correspond to one or more boosted ESD clamp circuits with high holding voltage as described above.

Generally speaking, chip 1102 may include an electronic component package configured to be mounted onto PCB 1101 using any suitable packaging technology such as, for example, Ball Grid Array (BGA) packaging or the like. In some applications, PCB 1101 may be mechanically mounted within or fastened onto electronic device 1100. It should be noted that, in certain implementations, PCB 1101 may take a variety of forms and/or may include a plurality of other elements or components in addition to chip 1102. It should also be noted, however, that in some embodiments PCB 1101 may not be used and/or chip 1102 may assume other forms.

Although the example of FIG. 11 shows electronic chip 1102 in monolithic form, it should be understood that, in alternative embodiments, the systems and methods described herein may be implemented with discrete components. For example, in some cases, one or more transistors, resistors, capacitors, diodes, logic gates, multiplexers, latches, flip-flops, etc. may be located outside of chip 1102, and one or more of these external components may be operably coupled to an IC fabricated within chip 1102.

As discussed above, in an illustrative, non-limiting embodiment, an integrated circuit may include a trigger circuit operably coupled to a first voltage bus and to a reference bus; a diode including an anode terminal operably coupled to a second voltage bus, the second voltage bus distinct from the first voltage bus; a transistor including a gate operably coupled to an output terminal of the trigger circuit, a drain operably coupled to a cathode terminal of the diode, and a source operably coupled to the reference bus; and an I/O cell operably coupled to the first voltage bus, the second voltage bus, and the reference bus. For example, the trigger circuit may include slew rate circuitry configured to turn on the transistor in response to an ESD event occurring at the I/O cell.

In some embodiments, the transistor and the diode in combination may present an effective holding voltage that is higher than a holding voltage of the transistor alone, the higher effective holding voltage configured to protect the transistor from collapsing into sustained bipolar breakdown as a result of an EOS event. For example, the EOS event may include a Burn-In (BI) process.

The transistor may be configured to protect an integrated circuit powered by the second voltage bus from the ESD event. Upon occurrence of the ESD event, the trigger circuit may be configured to receive a first portion of an ESD current via the first voltage bus, and the transistor may be configured to direct a second portion of the ESD current received via the second voltage bus to the reference bus, the first portion of the ESD current smaller than the second portion.

The trigger circuit may also be configured to overdrive the gate of the transistor upon having received the first portion of the ESD current to compensate, at least in part, for the higher effective holding voltage. To overdrive the gate of the transistor, the trigger circuit may be configured to set a gate-to-source voltage of the transistor to a value greater than that of a drain-to-source voltage of the transistor.

The I/O cell may be operably coupled to the trigger circuit via the first voltage bus and to the anode terminal of the diode via the second voltage bus. The I/O cell may also include an I/O pad, where the anode terminal of the diode is operably coupled to the I/O pad via a second diode, and wherein the trigger circuit is operably coupled to the I/O pad via a third diode. In some cases, the second diode may have a larger surface area than the third diode.

In some cases, the integrated circuit may also include a second diode including an anode terminal operably coupled to the second voltage bus; and a second transistor including a gate operably coupled to the output terminal of the trigger circuit, a drain operably coupled to a cathode terminal of the second diode, and a source operably coupled to the reference bus. A first node between the diode and the transistor may be operably coupled to a second node between the second diode and the second transistor. Alternatively, a first node between the diode and the transistor may be isolated from a second node between the second diode and the second transistor.

In another illustrative, non-limiting embodiment, an ESD protection circuit may include an ESD clamp having a transistor coupled in series with a diode; and a trigger circuit configured to set a gate-to-source voltage of the transistor to a value greater than that of a drain-to-source voltage of the transistor.

The trigger circuit may be operably coupled to a first voltage bus, and the ESD clamp may be operably coupled to a second voltage bus. An input/output (I/O) cell susceptible to the ESD event may be operably coupled to the first voltage bus and to the second voltage bus. The I/O cell may include an I/O pad, where the diode is operably coupled to the I/O pad via a second diode, the trigger circuit is operably coupled to the I/O pad via a third diode, and the second diode has a larger surface area than the third diode. In some cases, the ESD clamp includes another transistor coupled in series with another diode. Also, a node between the diode and the transistor may be isolated from a node between the other diode and the other transistor.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An integrated circuit, comprising:
   a trigger circuit operably coupled to a first voltage bus and to a reference bus;
   a diode including an anode terminal operably coupled to a second voltage bus, the second voltage bus distinct from the first voltage bus;

a transistor including a gate operably coupled to an output terminal of the trigger circuit, a drain operably coupled to a cathode terminal of the diode, and a source operably coupled to the reference bus; and an input/output (I/O) cell operably coupled to the first voltage bus, the second voltage bus, and the reference bus.

2. The integrated circuit of claim 1, wherein the trigger circuit includes slew rate circuitry configured to turn on the transistor in response to an Electrostatic Discharge (ESD) event occurring at the I/O cell.

3. The integrated circuit of claim 2, wherein the transistor and the diode in combination present an effective holding voltage that is higher than a holding voltage of the transistor alone, the higher effective holding voltage configured to protect the transistor from collapsing into sustained bipolar breakdown as a result of an Electrical Overstress (EOS) event.

4. The integrated circuit of claim 3, wherein the EOS event includes a Burn-In (BI) process.

5. The integrated circuit of claim 3, wherein the transistor is configured to protect an integrated circuit powered by the second voltage bus from the ESD event.

6. The integrated circuit of claim 3, wherein upon occurrence of the ESD event, the trigger circuit is configured to receive a first portion of an ESD current via the first voltage bus, and the transistor is configured to direct a second portion of the ESD current received via the second voltage bus to the reference bus, the first portion of the ESD current smaller than the second portion.

7. The integrated circuit of claim 6, wherein the trigger circuit is configured to overdrive the gate of the transistor upon having received the first portion of the ESD current to compensate, at least in part, for the higher effective holding voltage.

8. The integrated circuit of claim 7, wherein to overdrive the gate of the transistor, the trigger circuit is configured to set a gate-to-source voltage of the transistor to a value greater than that of a drain-to-source voltage of the transistor.

9. The integrated circuit of claim 1, wherein the I/O cell is operably coupled to the trigger circuit via the first voltage bus and to the anode terminal of the diode via the second voltage bus.

10. The integrated circuit of claim 9, wherein the I/O cell includes an I/O pad, wherein the anode terminal of the diode is operably coupled to the I/O pad via a second diode, and wherein the trigger circuit is operably coupled to the I/O pad via a third diode.

11. The integrated circuit of claim 10, wherein the second diode has a larger surface area than the third diode.

12. The integrated circuit of claim 1, further comprising:
a second diode including an anode terminal operably coupled to the second voltage bus; and
a second transistor including a gate operably coupled to the output terminal of the trigger circuit, a drain operably coupled to a cathode terminal of the second diode, and a source operably coupled to the reference bus.

13. The integrated circuit of claim 12, wherein a first node between the diode and the transistor is operably coupled to a second node between the second diode and the second transistor.

14. The integrated circuit of claim 12, wherein a first node between the diode and the transistor is isolated from a second node between the second diode and the second transistor.

15. An Electrostatic Discharge (ESD) protection circuit, comprising:
an ESD clamp including a transistor coupled in series with a diode;
a trigger circuit configured to set a gate-to-source voltage of the transistor to a value greater than that of a drain-to-source voltage of the transistor, wherein the trigger circuit is operably coupled to a first voltage bus, and wherein the ESD clamp is operably coupled to a second voltage bus; and
an input/output (I/O) cell susceptible to the ESD event, the I/O cell operably coupled to the first voltage bus and to the second voltage bus.

16. The ESD protection circuit of claim 15, wherein the I/O cell includes an I/O pad, wherein the diode is operably coupled to the I/O pad via a second diode, wherein the trigger circuit is operably coupled to the I/O pad via a third diode, and wherein the second diode has a larger surface area than the third diode.

17. The ESD protection circuit of claim 15, wherein the ESD clamp includes another transistor coupled in series with another diode.

18. The ESD protection circuit of claim 17, wherein a node between the diode and the transistor is isolated from a node between the other diode and the other transistor.

* * * * *